United States Patent
Aihara et al.

(10) Patent No.: US 6,727,769 B2
(45) Date of Patent: Apr. 27, 2004

(54) CRYSTAL OSCILLATOR CIRCUIT USING CMOSFETS

(75) Inventors: Katsuyoshi Aihara, Kawagoe (JP); Ryoji Iwakura, Sayama (JP); Takakazu Yano, Tokyo (JP); Yukio Otaka, Tokorozawa (JP); Shinichi Komine, Kawagoe (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 10/157,999

(22) Filed: May 31, 2002

(65) Prior Publication Data

US 2002/0180542 A1 Dec. 5, 2002

(30) Foreign Application Priority Data

Jun. 1, 2001 (JP) ........................................ 2001-165964

(51) Int. Cl.[7] ................................................. H03B 5/32
(52) U.S. Cl. ................................... 331/158; 331/116 FE
(58) Field of Search ............................... 331/158, 160, 331/116 R, 116 FE; 368/159

(56) References Cited

U.S. PATENT DOCUMENTS 4,896,122 A * 1/1990 Tahernia et al. ............ 331/158
6,169,462 B1 * 1/2001 White ......................... 331/158
6,408,008 B1 * 6/2002 Komarek et al. ........... 370/458

FOREIGN PATENT DOCUMENTS

JP 53-038249 4/1978
JP 57-187684 11/1982

* cited by examiner

*Primary Examiner*—Timothy P. Callahan
*Assistant Examiner*—Cassandra Cox
(74) *Attorney, Agent, or Firm*—Finnegan, Henderson, Farabow, Garrett & Dunner, L.L.P.

(57) ABSTRACT

A crystal oscillator circuit using CMOSFETs including an oscillator circuit that is constructed of a resonating section and an amplifying section having a CMOSFET, a reference current source circuit for generating a reference current which determines a bias current of the amplifying section, and a control signal generator circuit for controlling the reference current source circuit to make a bias current larger than that in the oscillation status when the oscillator circuit is in the non-oscillation status. As a result, the reference current source circuit constant-current biases the DC bias of the amplifying section without depending on the source voltage. Therefore, it can lower the driving source voltage of the oscillator circuit. Further, only the bias current of the amplifying section is increased during the oscillation starting period of the oscillator circuit, so that the oscillator circuit can provide a stable oscillation with low power, without variations in the source voltage.

9 Claims, 12 Drawing Sheets

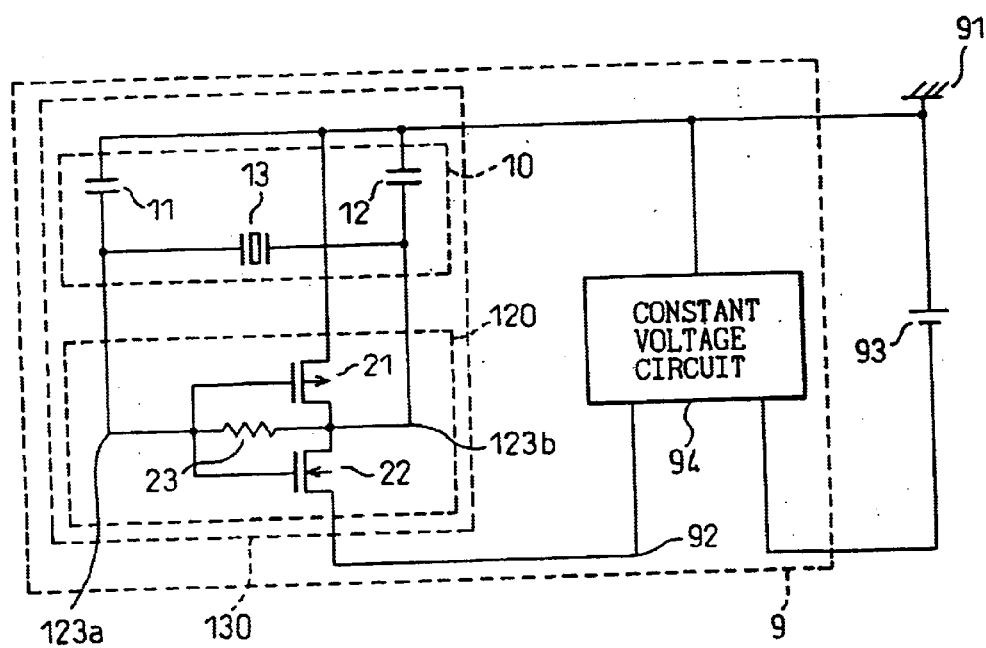
Fig.1 "PRIOR ART"

CRYSTAL OSCILLATOR CIRCUIT USING CMOSFETS

BACKGROUND OF THE INVENTION

1. Field of the Invention

The present invention relates to a crystal oscillator circuit that uses CMOSFETs (Complementary Metal Oxide Semiconductor Field Effect Transistors). The invention particularly relates to a structure of a crystal oscillator circuit in which an amplifying section consisting of CMOSFETs excites a resonating section containing capacitors and a crystal.

2. Description of the Related Art

In recent years, along the digitalization of electronic devices, there has been progressive improvement in crystal oscillator circuits that can produce accurate frequencies. Crystal oscillator circuits are being used as frequency signal (clock pulse) generator circuits in computers, as well as in electronic timepieces.

A conventional crystal oscillator circuit has been constructed of an oscillator circuit having an amplifying section and a resonating section, and a constant-voltage circuit. The constant-voltage circuit lowers the source voltage of a battery or the like to a regulated voltage, and this voltage is used as the power source of the crystal oscillator circuit. The amplifying section is constructed of CMOSFETs, and a high-resistance feedback resistor is connected between an input terminal and an output terminal of the amplifying section.

The resonating section is for obtaining a predetermined frequency, and has an oscillator circuit consisting of two capacitors and a crystal. This crystal is connected between the input terminal and the output terminal of the amplifying section. The crystal in the resonating section mechanically oscillates, and the amplitude of this oscillation gradually reduces. Therefore, the amplifying section amplifies the oscillation of the crystal oscillator, and applies positive feedback between the resonating section and the amplifying section, thereby compensating the attenuation maintaining the oscillation of the crystal oscillator.

In the case of a portable electronic device such as an electronic timepiece, a silver oxide battery or a lithium battery having a voltage range of about 1.3 V to 3.0 V is used for the power source of this device. In order to decrease the number of times of replacing a battery of the portable device, the voltage of the oscillator circuit or a divider that is connected to a latter stage of this oscillator circuit is lowered from the battery voltage by a constant-voltage circuit. The driving power of the device is restricted in this way.

However, when the electronic timepiece is completely in the stopped status, or when the timepiece has stopped temporarily due to some disturbance in the normal driving status, an attempt to drive the oscillator circuit with the constant-voltage circuit at the oscillation start initial stage brings about such a problem that the oscillation starting period of the oscillator circuit becomes long or the oscillator circuit does not start oscillating.

This problem occurs because the DC bias of the amplifying section is always fixed to one half of the source voltage, as the high-resistance feedback resistor is connected between the input terminal and the output terminal of the amplifying section of the crystal oscillator circuit. Therefore, the oscillator circuit cannot operate unless a voltage of about two times the threshold voltage of the CMOSFETs, that constitute the amplifying section, is supplied as the source of the oscillator circuit, which is disadvantageous for driving at a low voltage.

The phenomenon that the starting period of the oscillator circuit is long at the oscillation start initial stage and the phenomenon that the oscillator circuit does not oscillate are attributable to a fact that amplification factors of an amplification PMOSFET (P-channel MOSFET) and an amplification NMOSFET (N-channel MOSFET), that constitute the CMOSFETs, are small.

Therefore, when the oscillator circuit stops oscillation, a measure may be taken to increase the amplification factors of the amplification PMOSFET and the amplification NMOSFET. According to this measure, the oscillation status and the non-oscillation status of the oscillator circuit are detected. When the oscillation is stopped, the oscillator circuit is driven at the source voltage in this status. When the oscillator circuit is in steady oscillation, the constant-voltage circuit lowers the source voltage to the regulated voltage in order to restrict power consumption, and the oscillator circuit is driven at this lower voltage.

However, according to the conventional oscillator circuit, the DC bias point is determined as one half of the source voltage. Therefore, for the oscillator circuit to operate stably, the source voltage for application to the oscillator circuit cannot be set equal to or lower than the threshold voltages of the amplification PMOSFET and the amplification NMOSFET. Consequently, there has been a limit to making the oscillator circuit oscillate at low power.

Further, when the oscillator circuit is driven at the source voltage during the oscillation starting period and also when the source voltage is lowered to the regulated voltage with the constant-voltage circuit during the steady oscillation period, there are the following problems. The regulated output voltage varies due to a shortage in responsiveness to the frequency of the constant-voltage circuit during the voltage fall period from when the oscillator circuit starts oscillation till when the oscillation becomes steady. As a result, an inconvenience occurs in that the oscillator circuit stops oscillating or the oscillation is not stabilized.

In order to increase the responsiveness to the frequency of the constant-voltage circuit, the frequency characteristics may be improved by increasing the drive current of the constant-voltage circuit. However, this leads to an increase in total power consumption of the crystal oscillator circuit, which is disadvantageous for the driving at low power.

Further, in general, a PMOSFET and an NMOSFET that constitute an integrated circuit have processing size errors due to variations in the environment temperature and manufacturing. As the regulated voltage generated by the constant-voltage circuit and the characteristics of the amplifying section vary due to the processing size errors, the oscillator circuit cannot provide stable oscillation characteristics.

SUMMARY OF THE INVENTION

It is an object of the present invention to provide a crystal oscillator circuit that can minimize variations in characteristics during a period from when the oscillator circuit starts oscillating until the oscillation becomes steady, thereby to stabilize the oscillation of the oscillator circuit, in the oscillator circuit consisting of a resonating section having capacitors and a crystal oscillator, and an amplifying section that excites this resonating section.

In order to achieve the above object, according to a first aspect of the present invention, there is provided a crystal oscillator circuit using a CMOSFET, the crystal oscillator circuit comprising: an oscillator circuit that is constructed of a resonating section having capacitors and a crystal oscillator, and an amplifying section having a CMOSFET for exciting the resonating section; a reference current source circuit for generating a reference current which determines a bias current of the amplifying section that has a reference current control section for setting a reference current and a reference current generator section for generating a reference current; and a control signal generator circuit that detects whether the oscillator circuit is in the oscillation status or in the non-oscillation status, and when the oscillator circuit is in the non-oscillation status, that generates a control signal for controlling the reference current control section to set the reference current which makes a bias current of said amplifying section larger than that in the oscillation status.

According to a second aspect of the invention, there is provided a crystal oscillator circuit of the above first aspect, wherein the oscillator circuit, the reference current source circuit, and the control signal generator circuit are connected between a reference potential and the other end of a battery of which one electrode is connected to the reference potential, respectively, and the crystal oscillator circuit operates using the battery voltage as the source voltage.

According to a third aspect of the invention, there is provided a crystal oscillator circuit of the above second aspect, wherein the reference current control circuit consists of at least two reference resistors connected in parallel between the reference potential and a connection point that is connected to the reference current generator circuit, and the crystal oscillator circuit changes over a value of a combined resistance of the reference resistors based on a control signal from the control signal generator circuit.

According to a fourth aspect of the invention, there is provided a crystal oscillator circuit of the above third aspect, wherein the crystal oscillator circuit changes over the combined resistance based on the control signal to at least one switching transistor that is connected in series with the reference resistors.

According to a fifth aspect of the invention, there is provided a crystal oscillator circuit of the above fourth aspect, wherein the switching transistor is a control MOSFET.

According to a sixth aspect of the invention, there is provided a crystal oscillator circuit of the above first aspect, wherein a constant-voltage circuit for generating a regulated voltage that is a reduced voltage of the source voltage of the battery is provided between a reference potential and the other end of a battery of which one electrode is connected to the reference potential, and the oscillator circuit, the reference current source circuit, and the control signal generator circuit are connected between the reference potential and a line for supplying this regulated voltage, respectively, and the crystal oscillator circuit operates using the regulated voltage as the source voltage.

According to a seventh aspect of the invention, there is provided a crystal oscillator circuit of the above sixth aspect, wherein a current control device is connected between the amplifying section and the line, and the current control device is controlled by the reference current source circuit.

According to an eighth aspect of the invention, there is provided a crystal oscillator circuit of the above seventh aspect, wherein the current control device is a PMOSFET, a gate of the PMOSFET is connected to the reference current source circuit via a high-resistance resistor, and a voltage applied to the gate is linked to a change in the bias current to the amplifying section.

According to a ninth aspect of the invention, there is provided a crystal oscillator circuit of any one of the above first to eighth aspects, wherein the control signal generator circuit has two charging and discharging circuits connected in parallel that have mutually different charge and discharge statuses for the same input signal, output signals of the two charging and discharging circuits are input to an OR circuit, and an output of the OR circuit becomes the control signal.

In the crystal oscillator circuit of the present invention, there are provided a reference current source circuit that has a reference current generator section that generates a reference current for determining a bias current of an amplifying section, and a reference current control section that determines the reference current by controlling the reference current generator section; and a control signal generator circuit that controls the-reference current control section.

In the structure of the present invention, the control signal generator circuit detects oscillation and non-oscillation of the oscillator section. The reference current control section is controlled based on an output signal of a result of the detection, thereby to set a current that flows to the reference current source circuit.

The reference current source circuit controls the bias current of the amplifying section during the oscillation period and during the non-oscillation period, and sets amplification factors of the amplifying section that are suitable for the oscillation starting period and the steady oscillation period.

As a result, it is possible to minimize variations in characteristics during the period from when the oscillator section starts oscillation until the oscillation becomes steady, and make the section oscillate instantly with low power. Further, it is possible to obtain oscillation characteristics that make it possible to achieve a stable and steady oscillation.

BRIEF DESCRIPTION OF THE DRAWINGS

The present invention will be more clearly understood from the description as set forth below with reference to the accompanying drawings.

FIG. 1 is a circuit diagram showing a structure of a crystal oscillator circuit using a CMOSFET according to a conventional technique.

DESCRIPTION OF THE PREFERRED EMBODIMENTS

Figure 2A:
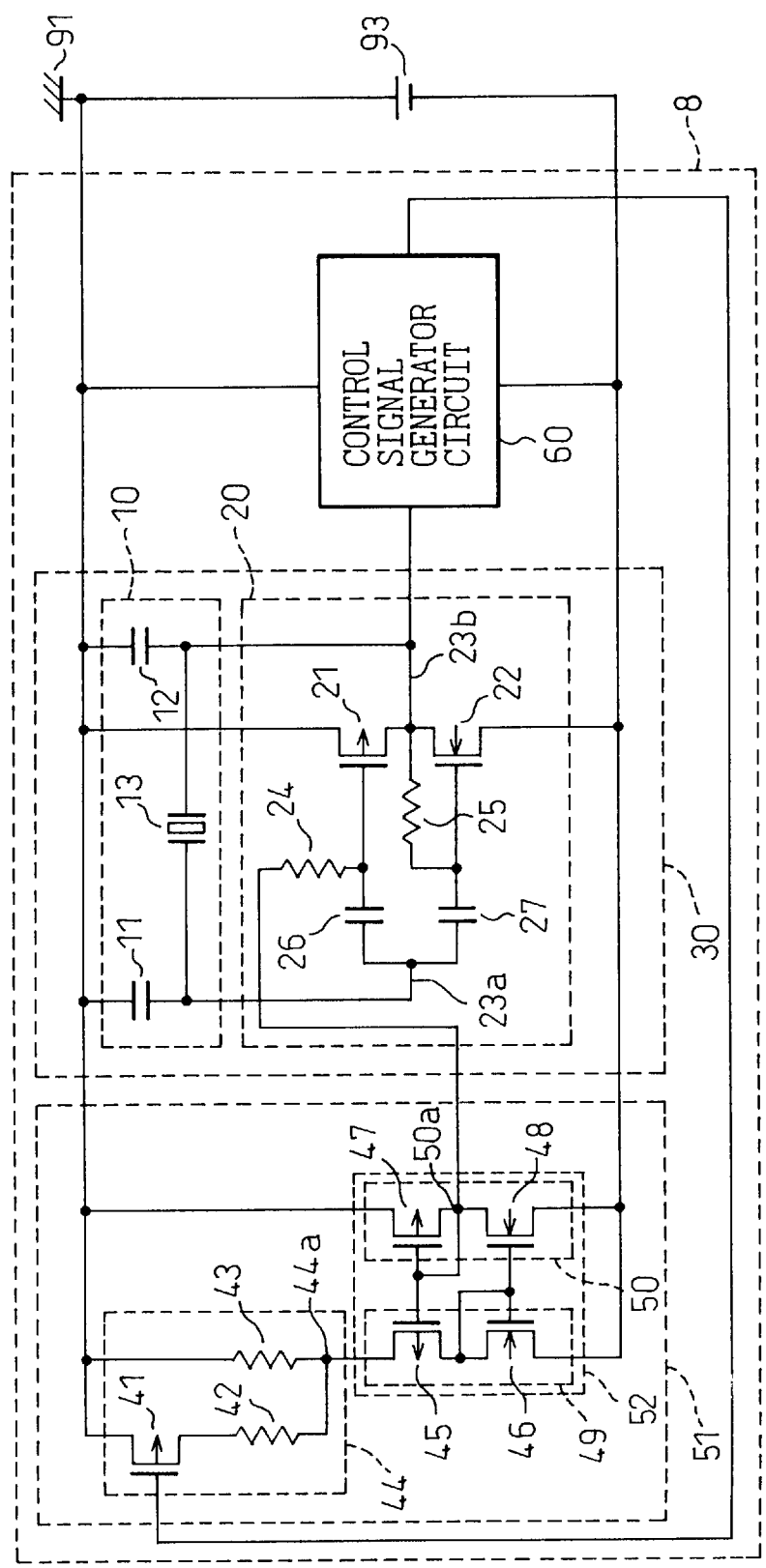
FIG. 2A is a circuit diagram showing a structure of a crystal oscillator circuit using a CMOSFET according to a first embodiment of the present invention.

Before describing the preferred embodiments, an explanation will be given of a conventional crystal oscillator circuit using a CMOSFET shown in FIG. 1.

As an example of a conventional technique of a crystal oscillator circuit using a CMOSFET, there will be explained a structure and operation of a crystal oscillator circuit generally used for an electronic timepiece.

FIG. 1 shows a structure of only a crystal oscillator circuit that is used for an electronic timepiece, and structures of other circuits of the electronic timepiece are omitted from the drawing. A conventional crystal oscillator circuit 9 is constructed of an oscillator circuit 130 having an amplifying section 120 and a resonating section 10, and a constant-voltage circuit 94. This crystal oscillator circuit 9 uses the source voltage from a battery 93 that has been lowered to a regulated voltage by the constant-voltage circuit 94, as the power source. The regulated voltage is supplied from the constant-voltage circuit 94 to the oscillator circuit 130 via a line 92.

The amplifying section 120 has a CMOSFET in which an amplification PMOSFET 21 and an amplification NMOSFET 22 (hereinafter to be simply referred to as a PMOSFET 21 and an NMOSFET 22) operate complementarily. A feedback resistor 23 of high resistance is connected between an input terminal 123a and an output terminal 123b of the amplifying section 120.

The resonating section 10 is constructed of a first capacitor 11, a second capacitor 12, and a crystal oscillator 13.

The first capacitor 11 and the second capacitor 12 have their one terminal connected to a reference potential 91 respectively. The first capacitor 11 has the other terminal connected to the input terminal 123a of the amplifying section 120, and the second capacitor 12 has the other terminal connected to the output terminal 123b of the amplifying section 120. The crystal oscillator 13 is connected to between the input terminal 123a and the output terminal 123b of the amplifying section 120.

This resonating section 10 constitutes a resonance circuit. The resonance frequency of the resonance circuit has been adjusted to 32.768 kHz. The output of the amplifying section 120 is positively fed back to the resonating section 10 to compensate for the attenuation of mechanical oscillation of the crystal oscillator 13. With this arrangement, the oscillation of the crystal oscillator 13 is maintained.

In general, a silver oxide battery or a lithium battery having a voltage range of about 1.3 V to 3.0 V is used for the power source of a portable device like a wrist watch. A portable device is particularly required to minimize its driving power, extend battery life, reduce environmental disruption due to the abandonment of batteries, and decrease the number of times of exchanging batteries by users. For this purpose, the portable device is provided with the constant-voltage circuit 94 that lowers the voltage of a divider, not shown and connected to the oscillator circuit 130 or at a latter stage, from the battery voltage. Thus, the driving force is restricted.

However, when the electronic timepiece is completely in the stopped status, or when the timepiece has stopped temporarily due to some disturbance in the normal driving status, an attempt to drive the oscillator circuit 130 with the constant-voltage circuit 94 at the oscillation start initial stage brings about such a phenomenon that the oscillation starting period of the oscillator circuit 130 becomes long or the oscillator circuit 130 does not start oscillating.

This problem occurs because the DC bias of the amplifying section 120 is always fixed to one half of the source voltage, as the high-resistance feedback resistor 23 is connected between the input terminal 123a and the output terminal 123b of the amplifying section 120.

Therefore, the oscillator circuit 130 cannot operate, unless a voltage of about two times the threshold voltage of the PMOSFET 21 and the NMOSFET 22 that constitute the amplifying section 120 is supplied as the source of the oscillator circuit 130. This means that, as transistor characteristics, the MOSFETs operate in a linear region or a saturation region in which the source voltage is higher than the threshold voltage.

The amplifying section 120 increases the signal amplification factor to a maximum near an operation point at which the CMOSFET consisting of the PMOSFET 21 and the NMOSFET 22 is complementarily changed over from a high level to a low level, or from a low level to a high level. When the CMOSFET operates in the saturation region, the amplification factor increases in proportion to the source voltage. This operation point is the DC bias point. The phenomenon that the starting period of the oscillator circuit 130 is long at the oscillation start initial stage and the phenomenon that the oscillator circuit 130 does not oscillate are attributable to a fact that amplification factors of the PMOSFET 21 and the NMOSFET 22 are small.

Therefore, while the oscillator circuit 130 stops oscillation, a measure may be taken to increase the amplification factors of the PMOSFET 21 and the NMOSFET 22. According to this measure, the oscillation status and the non-oscillation status of the oscillator circuit 130 are detected. When the oscillator circuit 130 is in the oscillation stop status, the oscillator circuit 130 is driven at the source voltage of the battery 93 in this status. When the oscillator circuit 130 is in steady oscillation, the constant-voltage circuit 94 lowers the source voltage of the battery 93 to the regulated voltage in order to restrict power consumption. The oscillator circuit 130 is driven at this fallen voltage that is supplied to the oscillator circuit 130 through the line 92.

However, according to the oscillator circuit 130 of the conventional technique, the DC bias point is determined as one half of the source voltage of the battery 93. Therefore, in order to obtain a stable oscillation operation, the source voltage for application to the oscillator circuit 130 cannot be set equal to or lower than the threshold voltages of the PMOSFET 21 and the NMOSFET 22. Consequently, there has been a limit to making the oscillator circuit 130 oscillate with low power.

Further, when the oscillator circuit 130 is driven at the source voltage of the battery 93 during the oscillation starting period and also when the source voltage is lowered to the regulated voltage with the constant-voltage circuit 94 during the steady oscillation period, there are the following problems. The regulated output voltage varies due to a shortage in responsiveness to the oscillation frequency of the constant-voltage circuit 94 during the voltage fall period from when the oscillator circuit 130 starts oscillation till when the oscillation becomes steady. As a result, such an inconvenience occurs that the oscillator circuit 130 stops oscillation or the oscillation is not stabilized.

In order to increase the responsiveness to the oscillation frequency of the constant-voltage circuit 94, the frequency characteristics may be improved by increasing the drive current of the constant-voltage circuit 94. However, this leads to an increase in total power consumption of the crystal oscillator circuit 9, which is disadvantageous for driving with low power. This output voltage variation occurs remarkably when there is a large voltage difference between the source voltage of the battery 93 and the regulated voltage obtained by lowering the voltage with the constant-voltage circuit 94.

Further, in general, a PMOSFET and an NMOSFET that constitute an integrated circuit have processing size errors due to variations in the environment temperature and manufacturing. As the regulated voltage generated by the constant-voltage circuit 94 and the characteristics of the amplifying section 120 vary due to the processing size errors, the oscillator circuit 130 cannot provide stable oscillation characteristics.

Therefore, the present invention provides a crystal oscillator circuit that can minimize variations in characteristics during a period from when the oscillation is started till when the oscillation becomes steady, thereby stabilizing the oscillation of the oscillator circuit, in the crystal oscillator circuit using a CMOSFET consisting of a resonating section having capacitors and a crystal oscillator, and an amplifying section that excites this resonating section.

Embodiments of optimum structures of the crystal oscillator circuit according to the present invention will be explained in detail below with reference to the attached drawings. In the following explanation, constituent elements that are identical to those used in the conventional crystal oscillator circuit explained with reference to FIG. 1 will be have like reference numerals.

First Embodiment

FIG. 2A is a circuit diagram showing a structure of a crystal oscillator circuit 8 according to a first embodiment of the present invention. The crystal oscillator circuit 8 of the first embodiment is constructed of an oscillator circuit 30, a reference current source circuit 51, and a control signal generator circuit 60. The oscillator circuit 30 is constructed of a resonating section 10 and an amplifying section 20. The reference current source circuit 51 is constructed of a reference current control section 44 and a reference current generator section 52. All circuits operate using a battery 93 as a power source. In other words, the crystal oscillator circuit 8 of the first embodiment does not have the constant-voltage circuit 94 of the conventional technique as explained with reference to FIG. 1, and is not driven based on the regulated voltage.

The reference current control section 44 that constitutes the reference current source circuit 51 is constructed of a control MOSFET 41, a first reference resistor 42, and a second reference resistor 43. The order of the resistance of the first reference resistor 42 is set lower than that of the resistance of the second reference resistor 43 by two or more digits. For example, when the first reference resistor 42 is set to a few dozens of KΩ, the second reference resistor 43 is set to a few MΩ.

The control MOSFET 41 and the first reference resistor 42 are connected in series with a current path between a reference potential 91 and a source voltage of the battery 93. The control MOSFET 41 has its source connected to the reference potential 91, and has its drain connected to one terminal of the first reference resistor 42. The first reference resistor 42 has its other terminal connected to a contact point 44a.

The second reference resistor 43 is connected to between the reference potential 91 and the contact point 44a. The second reference resistor 43 is connected in parallel with the control MOSFET 41 and the first reference resistor 42 that are connected in series. The control MOSFET 41 has its gate connected to the control signal generator circuit 60, and is controlled by a signal output from the control signal generator circuit 60.

The reference current generator section 52 is constructed of a first column 49 and a second column 50. The first column 49 is constructed of a first PMOSFET 45 and a first NMOSFET 46, and the second column 50 is constructed of a second PMOSFET 47 and a second NMOSFET 48. The gate of the first, PMOSFET 45 in the first column 49 and the gate of the second PMOSFET 47 in the second column 50 are connected to each other. The gate of the first NMOSFET 46 and the gate of the second NMOSFET 48 are also connected to each other.

The second PMOSFET 47 has its gate and drain connected to each other. The first NMOSFET 46 has its gate and drain also connected to each other. The first PMOSFET 45 has its source connected to the reference current control section 44 at the connection point 44a. The second PMOSFET 47 has its source connected to the reference potential 91. The source of the first NMOSFET 46 and the source of the second NMOSFET 48 are connected to the battery as the source voltage.

When the reference current control section 44 disposed between the reference potential 91 and the contact point 44a is replaced with one reference resistor, the reference current source circuit 51 becomes a band-gap-reference-type constant-voltage circuit that is generally known. The voltage of an output terminal 50a of the reference current control section 44 is determined by this reference resistor.

The oscillator circuit 30 is constructed of the resonating section 10 and the amplifying section 20 that are similar to the conventional ones. The resonating section 10 has a first capacitor 11, a second capacitor 12, and a crystal oscillator 13. The first capacitor 11 is connected to between the reference potential 91 and an input terminal 23a of the amplifying section 20. The second capacitor 12 is connected to between the reference potential 91 and an output terminal 23b of the amplifying section 20. The crystal oscillator 13 is connected to between the input terminal 23a and the output terminal 23b of the amplifying section 20. The amplifying section 20 is constructed of a CMOSFET consisting of a PMOSFET 21 and an NMOSFET 22 that complementarily operate to an input signal, a first high-resistance resistor 24, a second high-resistance resistor 25, a first coupling capacitor 26, and a second coupling capacitor 27.

The first coupling capacitor 26 and the second coupling capacitor 27 have their respective one terminal connected to the input terminal 23a of the amplifying section 20. The first coupling capacitor 26 has its other terminal connected to the gate of the PMOSFET 21, and the second coupling capacitor 27 has its other terminal connected to the gate of the NMOSFET 22.

The first coupling capacitor 26 and the second coupling capacitor 27 interrupt a DC potential variation of the input terminal 23a from being transferred to the gates of the PMOSFET 21 and the NMOSFET 22 respectively. This DC variation occurs when a leak current flows to the input terminal 23a of the amplifying section 20 due to the humidity or the like.

The first high-resistance resistor 24 and the second high-resistance resistor 25 are set to have resistances of a few hundred MΩ, so as not to feed back the AC signal of the oscillator circuit 30 to the reference current source circuit 51, by taking into account temperature coefficients of the resistors and manufacturing variation. The first coupling capacitor 26 and the second coupling capacitor 27 are used to transfer the AC component generated by the oscillator circuit 30 to the gates of the PMOSFET 21a and the NMOSFET 22 respectively. The capacities of the coupling capacitors 26 and 27 are set to about ten or more times of the gate capacities of the PMOSFET 21 and the NMOSFET 22, based on the divided-voltage ratio to the gate capacity. For example, when the gate capacity is 1 pF, the capacities of the coupling capacitors 26 and 27 are set to 10 pF.

The first high-resistance resistor 24 is connected to between the output terminal 50a of the reference current source circuit 51 and the gate of the PMOSFET 21. The second high-resistance resistor 25 is connected to between the output terminal 23b of the amplifying section 20 and the gate of the NMOSFET 22. With this arrangement, the PMOSFET 21 is constant-current biased by the reference current source circuit 51 via the first high-resistance resistor 24, and the NMOSFET 22 is given a DC voltage negative feedback by the second high-resistance resistor 25. The NMOSFET 22 is self-biased according to the biased result of the PMOSFET 21.

According to this structure, the control signal generator circuit 60 detects the oscillation status and the non-oscillation status of the oscillator circuit 30 based on the signal of the output terminal 23b. A signal based on this detection is output to the reference current control section 44 for the reference current control section 44 to execute the control. The reference current control section 44 controls and sets the current that flows to the reference current source circuit 51. Based on the current set by the reference current source circuit 51, the bias current of the amplifying section 20 of the oscillator circuit 30 is set. The amplification factor is changed between the oscillation period and the non-oscillation period of the oscillator circuit 30. The source-voltage of the battery 93 is not changed during the period from when the oscillator circuit 30 stops oscillation till when the oscillation starts, and further till when the oscillation becomes steady.

Figure 2B:
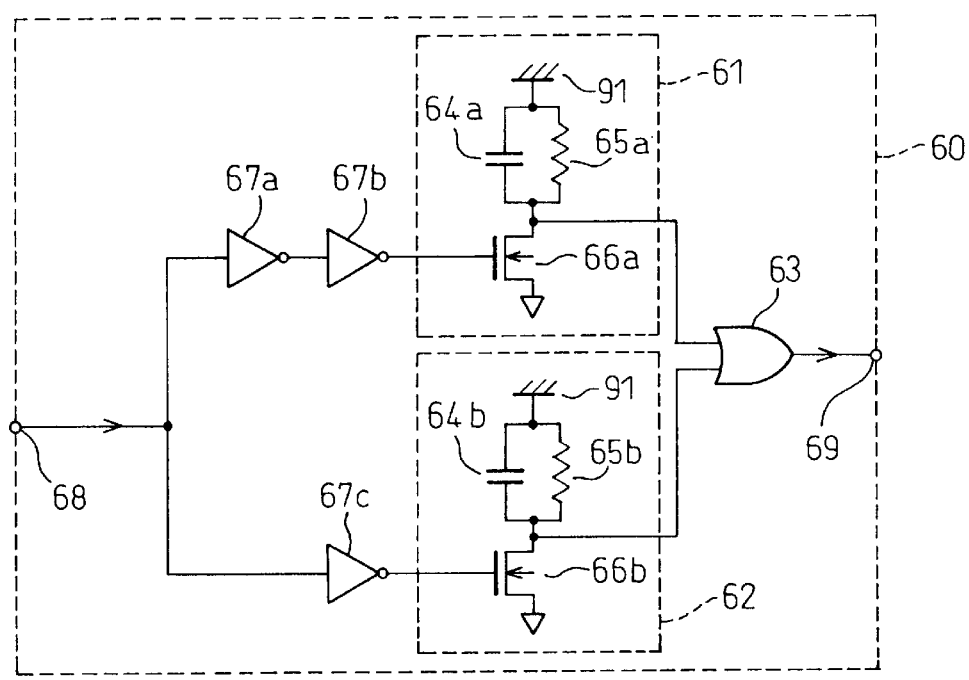
FIG. 2B is a circuit diagram showing one example of a control signal generator circuit in the crystal oscillator circuit shown in FIG. 2A.

FIG. 2B shows a structure of the control signal generator circuit 60 shown in FIG. 2A. The control signal generator circuit 60 has a first charging and discharging circuit 61, a second charging and discharging circuit 62, three inverters 67a, 67b, and 67c, and an OR circuit 63. The first charging and discharging circuit 61 is connected to an input terminal 68 via inverters 67a and 67b that are connected in series. On the other hand, the second charging and discharging circuit 62 is connected to the input terminal 68 via an inverter 67c. Outputs of the first and second charging and discharging circuits 61 and 62 respectively are connected to two input terminals of the two-input type OR circuit 63. An output of the OR circuit 63 is connected to an output terminal 69 of the control signal generator circuit 60.

The first charging and discharging circuit 61 is constructed of a capacitor 64a, a resistor 65a, and an NMOSFET 66a. The capacitor 64a and the resistor 65a are connected in parallel, and one end of this connection is connected to a reference potential 91, and the other end of this connection is connected to the drain of the ID NMOSFET 66a. The gate of the NMOSFET 66a is connected to the output of the inverter 67b.

The second charging and discharging circuit 62 is constructed of a capacitor 64b, a resistor 65b, and an NMOSFET 66b, in a similar manner to the first charging and discharging circuit 61. The gate of the NMOSFET 66b is connected to the output of the inverter 67c.

When a clock pulse has been input to the input terminal 68, one of the first charging and discharging circuit 61 and the second charging and discharging circuit 62 becomes in the charge status and the other becomes in the discharge status. In the charge status, the NMOSFET 66a is turned ON to charge the capacitor 64a. In the discharge status, the NMOSFET 66a is turned OFF to discharge the charge of the capacitor 64a via the resistor 65a.

Next, the operation of the crystal oscillator circuit 8 according to the first embodiment will be explained in detail. In the structure of the crystal oscillator circuit 8 shown in FIG. 2A, the reference current source circuit 51 can determine the bias of the amplifying section 20, without depending on the regulated voltage that is determined by the constant-voltage circuit 94 of the crystal oscillator circuit 9 according to the conventional technique shown in FIG. 1.

When the PMOSFET 21 that constitutes the amplifying section 20 has been biased to the vicinity of the threshold voltage by the reference current source circuit 51, the PMOSFET 21 operates in the region in which its drain current increases exponentially. At this time, the reference potential 91 is set to 0 V. The source voltage supplied from the battery 93 of which positive electrode is connected to this reference potential 91 is set to a negative voltage.

The oscillator circuit 30 can operate even when the source voltage is −0.5 V, based on the setting that the threshold voltage of the PMOSFET 21 is at −0.5 V, the threshold voltage of the NMOSFET 22 is at 0.5 V, and also when the reference current source circuit 51 biases the PMOSFET 21 to the vicinity of the threshold voltage.

As explained above, the amplification factor of the MOSFET in the exponential region in which the gate voltage is at or lower than the threshold voltage increases in proportion to the drain current, in a similar manner to that of the current amplification factor of a bipolar transistor. In other words, in order to operate this amplifying section 20 in the exponential region thereby to increase the amplification factor, it may be so arranged that the reference current source circuit 51 increases the bias current of the PMOSFET 21.

When the oscillator circuit 30 is not oscillating, the current of the reference current source circuit 51 is increased in order to increase the amplification factor of the PMOSFET 21, so that the bias current of the PMOSFET 21 in increased. On the other hand, when the oscillator circuit 30 is in steady oscillation, the reference current source circuit 51 decreases the current to the oscillator circuit 30 in order to operate the PMOSFET 21 with low power. The bias current of the PMOSFET 21 is lowered in this way, and the amplification factor of the PMOSFET 21 is lowered to the amplification factor that is minimum necessary for the oscillator. circuit to oscillate.

As explained above, the reference current source circuit 51 is used to determine the bias currents of the amplifying section 20 during the oscillation starting period and the steady oscillation period of the oscillator circuit 30 respectively. The voltage of the output terminal 50a of the reference current source circuit 51 is determined by the reference current control section 44. When the crystal oscillator circuit 8 has entered the stable oscillation region, a bias current that is constant at the source voltage of the battery 93 flows. The bias current of the PMOSFET 21 that constitutes the amplifying section 20 is determined based on the current flowing to the second column 50 that constitutes the reference current source circuit 51, and a ratio of a gate width W to a gate length L of the second PMOSFET 47 and the PMOSFET 21 respectively.

The current that flows in the oscillator circuit 30 determined by the reference current source-circuit 51 is changed over between a value applied to the oscillation starting period from when the oscillator circuit 30 starts oscillation in the stop status until the oscillation becomes steady, and a value applied to the steady oscillation period, by the reference current control section 44 that operates based on the signal output from the control signal generator circuit 60.

As shown in FIG. 2B, when a clock pulse has been input to the input terminal 68 of the control signal generator circuit 60, clock pulses of mutually different logic are input to the first charging and discharging circuit 61 and the second charging and discharging circuit 62 respectively. When one of these two charging and discharging circuits is in the charge status, the other is in the discharge status. If the reference potential 91 is at 0 V, and the source voltage supplied from the battery 93 is a negative voltage, the output of the charging and discharging circuit becomes a negative voltage level of the battery 93, when this circuit is in the charged status. The output of the charging and discharging circuit becomes the level of the reference potential 91, when this circuit is in the discharge status.

When a clock pulse has been input to the input terminal 68 of the control signal generator circuit 60 in the status that the oscillation of the oscillator circuit 30 is maintained, even when one of the charging and discharging circuit is in the discharge status, the other circuit is in the charge status with the other input clock pulse. Therefore, the output of the OR circuit 63 connected to the outputs of these charging and discharging circuits always outputs the source voltage level.

On the other hand, when the oscillation of the oscillator circuit 30 has stopped, one of the charging and discharging circuits is in the discharge status, and the discharging progresses. Therefore, when the threshold voltage of the OR circuit 63 is exceeded, the output of the OR circuit 63 is inverted from the source voltage level to become the reference potential level.

As explained above, the control signal generator circuit 60 detects the oscillation status and the non-oscillation status of the oscillator circuit 30, outputs a signal based on a result of this detection, and inputs the result to the reference current control section 44. In building the circuit shown in FIG. 2B into the circuit shown in FIG. 2A, the OR circuit 63 is set to the negative logic. The OR circuit 63 is set to output the source voltage level when the oscillation stop has been detected, and outputs the reference potential level when the oscillation has been detected.

When the oscillator circuit 30 is not oscillating, that is, when the oscillation of the oscillator circuit 30 is stopped, the control signal generator circuit 60 detects the oscillation stop of the oscillator circuit 30, and outputs the source voltage level. The control MOSFET 41 of the reference current control section 44 is turned ON. In this status, the first reference resistor 42, low in resistance, and the second reference resistor 43, high in resistance, of the reference current control section 44 enter a parallel connection status. Therefore, the combined resistance is determined by the first reference resistor 42 having low resistance. Consequently, the bias current of the PMOSFET 21 that constitutes the amplifying section 20 is determined based on the reference current determined by the first. reference resistor 42.

At this time, a bias current that is sufficient for the oscillator circuit 30 to start oscillation is supplied from the reference current source circuit 51 to the amplifying section 20. The PMOSFET 21 obtains a sufficient amplification factor, and the oscillator circuit 30 oscillates. After the oscillator circuit 30 has started oscillation, the oscillation becomes steady. Thereafter, the control signal generator circuit 60 detects the oscillation status of the oscillator circuit 30.

When the oscillation status of the oscillator circuit 30 has been detected, the reference potential level is output from the control signal generator circuit 60 to the reference current control section 44, and the control MOSFET 41 of the reference current control section 44 is turned OFF. A high signal is input to the gate of the control MOSFET 41 at this time. As the off. resistance of the control MOSFET 41 is larger than that of the second reference resistor 43 by a few digits, the combined resistance of the reference current control section 44 is determined by the second reference resistor 43, and the current that flows to the reference current source circuit 51 is determined. The bias current of the PMOSFET 21 that constitutes the amplifying section 20 is determined based on the reference current determined by the second reference resistor 43. The bias current of the PMOSFET 21 that constitutes the amplifying section 20 is lowered to a current that is the minimum necessary for steady oscillation. Changing the bias current changes the amplification factor of the amplifying section 20 as described above.

According to the above first embodiment, the first reference resistor 42 and the second reference resistor 43 are connected in parallel between the connection point 44a of the reference current control section 44 and the reference potential. The control MOSFET 41 is further connected in series with the first reference resistor 42. The combined resistance of the reference current control section 44 changes in two ways based on the state of the control MOSFET 41.

Figure 2C:
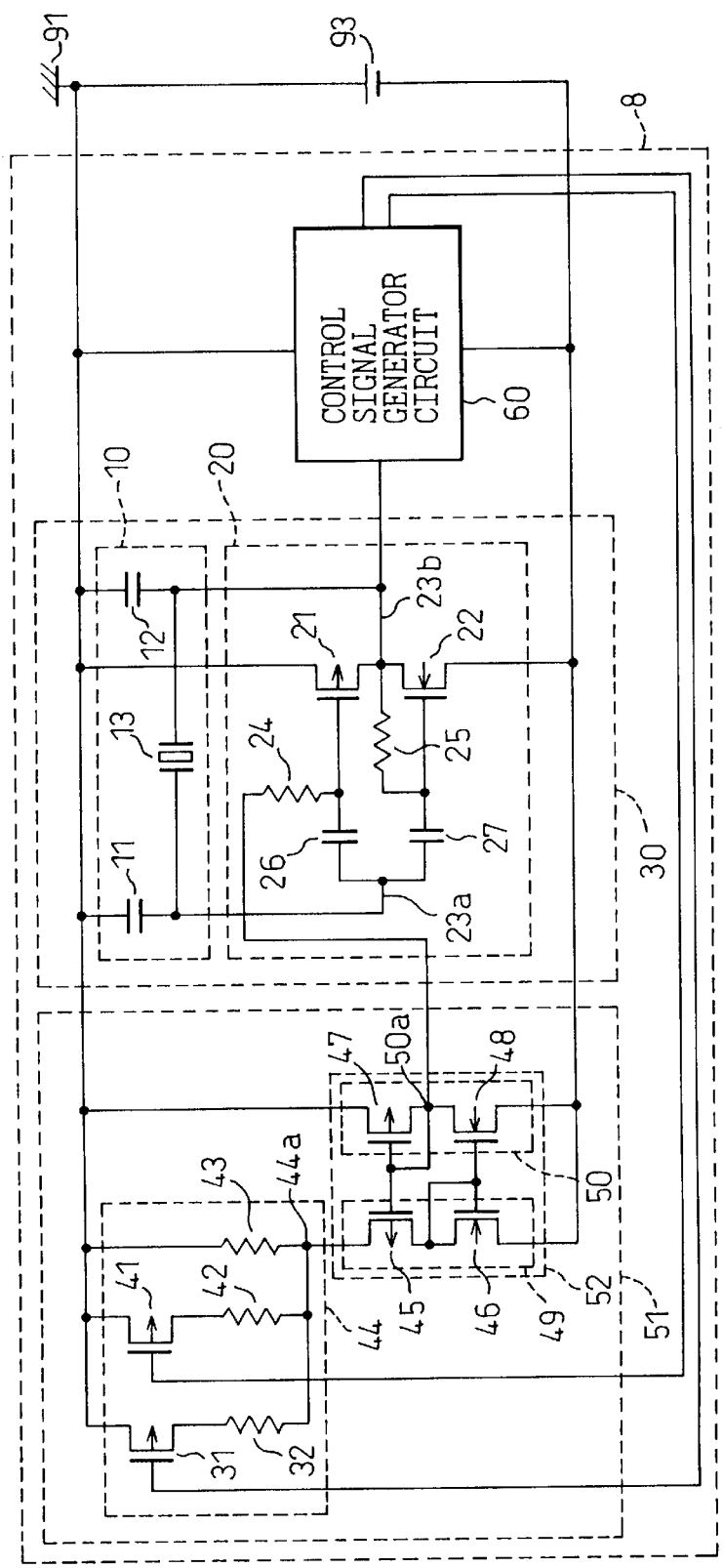
FIG. 2C, is a circuit diagram showing a circuit structure of a modification of the crystal oscillator circuit shown in FIG. 2A.

On the other hand, as a modification of the first embodiment, as shown in FIG. 2C, a circuit having a control MOSFET 31 and a third reference resistor 32 connected in series is further connected in parallel between a connection point 44a of a reference current control section 44 and a reference potential 91. The control MOSFET 31 is turned ON/OFF based on a control signal from a control signal generator circuit 60. Based on this structure, it is possible to change the combined resistance of the reference current control section 44 in four ways. Other constituent elements of FIG. 2C are exactly identical with those shown in FIG. 2B, and therefore, a further explanation of the circuit structure of FIG. 2C will be omitted.

The bias current and the overtone oscillation, that are important points of the crystal oscillator circuit of the present invention, will be explained in detail. First, the bias current will be explained.

Figure 3:
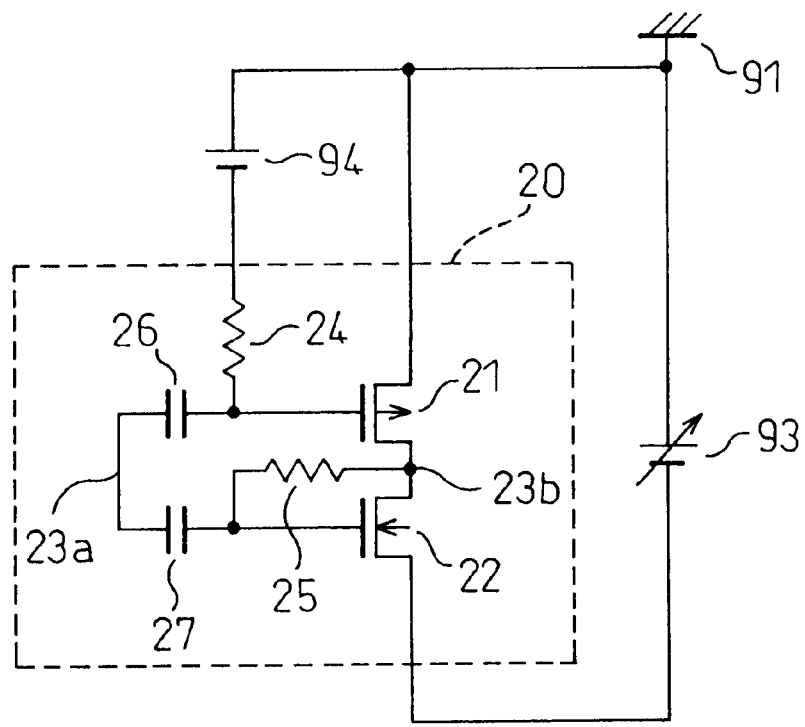
FIG. 3 is a circuit diagram showing a measuring circuit that measures characteristics of an amplifying section of the crystal oscillator circuit according to the present invention.

FIG. 3 is a circuit diagram that is used to measure a bias current, for explaining a DC bias current of an amplifying section 20. In FIG. 3, constituent elements that are identical with those shown in FIG. 2A are attached with like reference numbers. The circuit shown in FIG. 3 is an extraction of the amplifying section 20 of the oscillator circuit 30 shown in FIG. 2A. This circuit is for measuring the bias current that flows to the amplifying section 20 relative to a change in the source voltage of the battery 93 applied to the amplifying section 20, using a gate voltage Vg of the PMOSFET 21 that constitutes the amplifying section 20 as a parameter. In this circuit, a battery 94 is connected to between the first resistor 24 and the reference potential 91, as a DC source for applying a gate voltage to the PMOSFET 21.

Figure 5:
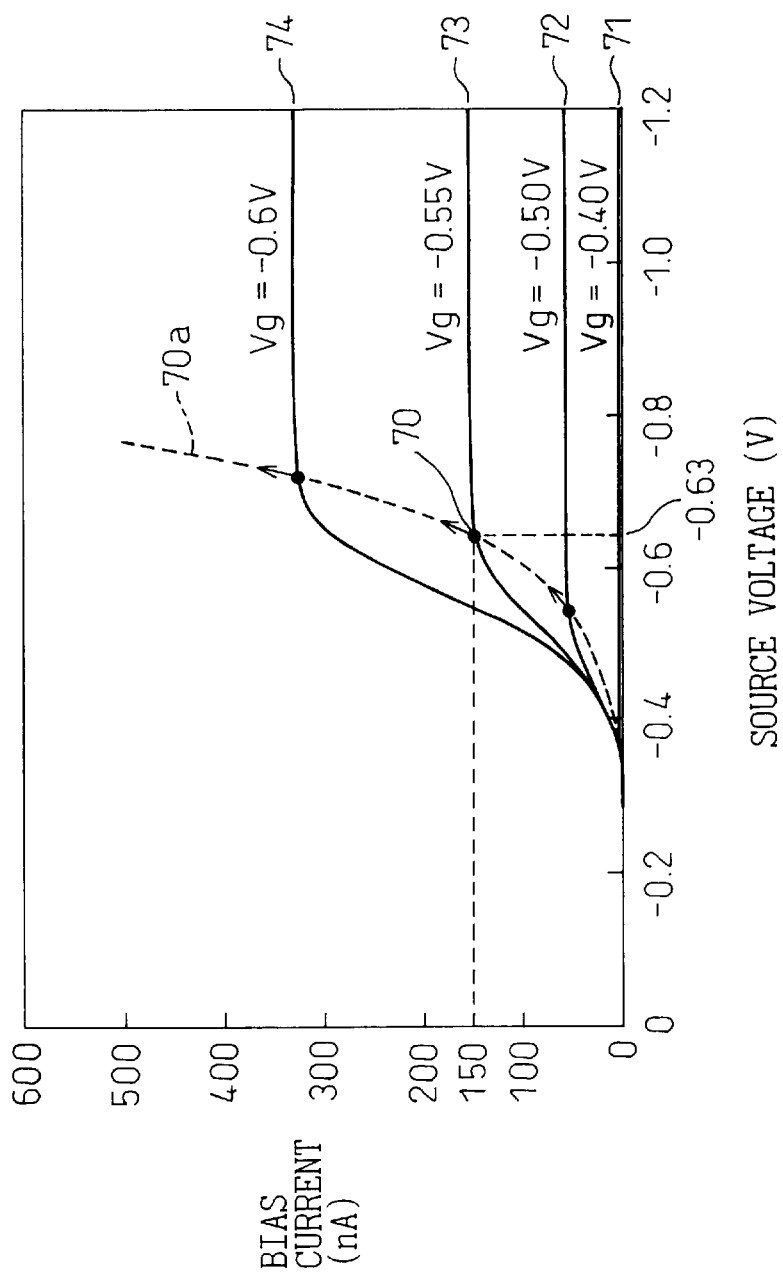
FIG. 5 is a characteristic diagram showing a relationship between a bias current that flows to the amplifying section and a source voltage of the crystal oscillator circuit according to the present invention.

FIG. 5 shows changes in the bias current that flows to the amplifying section 20 measured by the measuring circuit shown in FIG. 3, when the source voltage applied to the amplifying section 20 is changed, using a gate voltage Vg of the PMOSFET 21 that constitutes the amplifying section 20 as a parameter. The horizontal axis of the diagram shown in FIG. 5 represents the source voltage that is applied to the amplifying section 20 from the battery 93, and the vertical axis represents a current that flows to the amplifying section 20, or the bias current. The reference potential 91 is at 0V, and the source voltage is a negative voltage. The gate voltage Vg of the PMOSFET 21 that are used as parameters are as follows.

Vg is –0.40 V for a characteristic curve shown by a reference number 71.

Vg is –0.50 V for a characteristic curve shown by a reference number 72.

Vg is –0.55 V for a characteristic curve shown by a reference number 73.

Vg is –0.60 V for a characteristic curve shown by a reference number 74.

As shown in FIG. 5, when the source voltage is increased to a negative voltage side, the bias current that flows to the amplifying section 20 starts increasing at a certain level of the source voltage. When the gate voltage Vg of the PMOSFET 21 becomes lower relative to the reference potential 91 as shown in the characteristic curves 71, 72, 73 and 74, the saturation current that shows the constant current characteristics increases accordingly.

This shows that, depending on the gate voltage Vg that is applied to the PMOSFET 21, a point 70 at which the current becomes a constant current changes along a characteristic curve 70a shown by a broken line. From this diagram, it can be understood that as the gate voltage Vg becomes lower relative to the reference potential, the point 70 at which the current becomes a constant current shifts to the negative voltage side.

Figure 6:
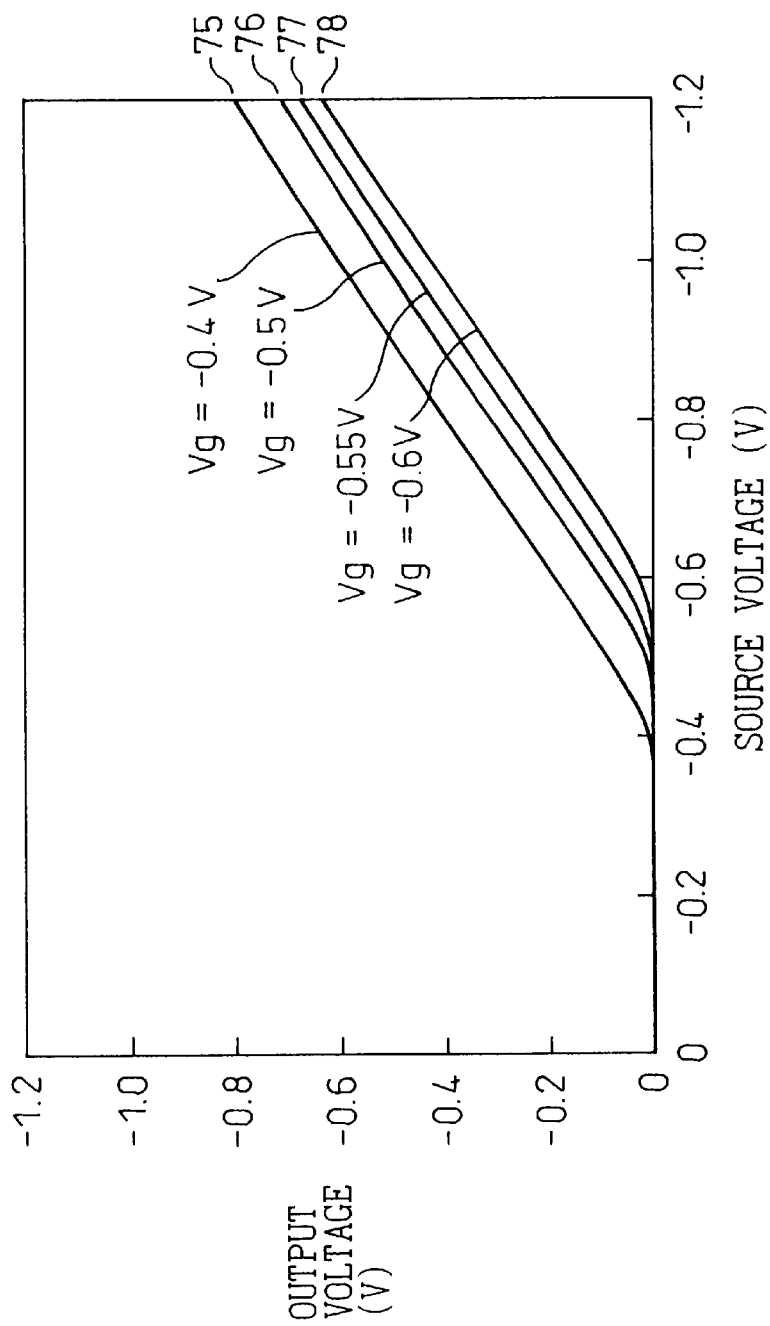
FIG. 6 is a characteristic diagram showing a relationship between an output voltage and a source voltage of the crystal oscillator circuit according to the present invention.

FIG. 6 shows changes in the voltage output from the output terminal 23b of the amplifying section 20 (hereinafter to be called an output voltage) measured by the measuring circuit shown in FIG. 3, when the source voltage is changed using the gate voltage Vg of the PMOSFET 21 as a parameter. The horizontal axis of the diagram shown in FIG. 6 represents a size of a source voltage that is applied to the amplifying section 20 from the battery 93, and the vertical axis represents an output voltage of the amplifying section 20. The output voltage in the vertical axis shows negative potentials upward, that is, the source voltage side.

The sizes of the gate voltage Vg of the PMOSFET 21 that are used as parameters are as follows.

Vg is –0.40 V for a characteristic curve shown by a reference number 75. is –0.50 V for a characteristic curve shown by a reference number 76.

Vg is –0.55 V for a characteristic curve shown by a reference number 77.

is –0.60 V for a characteristic curve shown by a reference number 78.

FIG. 6 shows that when the gate voltage Vg of the PMOSFET 21 becomes lower relative to the reference potential 91 while the source voltage applied to the amplifying section 20 remains constant, the output voltage shifts to the reference potential 91 side. Further, when the source voltage (negative voltage) applied to the amplifying section 20 increases, the output voltage of the amplifying section 20 shifts to the source voltage side relative to the reference potential 91. In the area at the right side of the characteristic curve 70a (that is, the area in which the source voltage increases to the negative side) shown in FIG. 5, the output voltage of the amplifying section 20 relative to the gate bias shifts only in parallel, as is clear from FIG. 6. Therefore, the output voltage of the amplifying section 20 changes relative to the source voltage, but the bias point is constant.

On the other hand, the area at the left side of the characteristic curve 70a (at the reference potential side) shown in FIG. 5 corresponds to the area of FIG. 6 in which the output voltage relative to the gate bias is deviated from the parallel lines. In other words, this is the area in which the bias current that flows to the PMOSFET 21 is not saturated. This is the area in which the bias point also changes to the reference potential side together with the output voltage of the amplifying section 20.

As explained above, it can be understood that, in order to bias the amplifying section 20 to always the saturation region of the PMOSFET 21, it is important to set a proper relationship between the source voltage and the gate bias.

In the crystal oscillator circuit 8 of the present invention, the oscillation status and the non-oscillation status of the oscillator circuit 30 are detected by the control signal generator circuit 60, and the control MOSFET 41 of the reference current control section 44 is controlled based on the signal of a result of this detection. In other words, when the oscillation status of the oscillator circuit 30 has been detected, the control MOSFET 41 is turned OFF, and when the non-oscillation status of the oscillator circuit 30 has been detected, the control MOSFET 41 is turned ON. When the control MOSFET 41 has been turned OFF, the reference potential that flows to the reference current control section 44 becomes small, and when the control MOSFET 41 has been turned ON, the reference potential that flows to the reference current control section 44 becomes large. As a result, the bias current of the amplifying section 20 that is determined based on the reference current increases during the oscillation starting period, and decreases during the steady oscillation period.

Although the amplification factor of the amplifying section 20 is increased during the oscillation starting period from the amplification factor during the steady oscillation period, it is not sufficient to simply increase the bias current during the oscillation starting period. It is necessary to set the amplification factor such that the DC bias is in the constant current region of the PMOSFET 21 that constitutes the amplifying section 20.

In other words, it can be understood from FIG. 5, that, when the source voltage is –0.63 V, a maximum bias current at which the PMOSFET 21 enters the constant current region is about 150 nA when the gate voltage Vg is –0.55 V.

On the other hand, even when an attempt is made to set the bias current to 150 nA or above by operating the gate voltage Vg, the PMOSFET 21 shifts from the constant current region to the linear region (shifts to the area at the left side of the characteristic curve 70a), and it is not possible to set the bias current.

FIG. 6 shows that when the gate voltage Vg is changed to the source voltage side (the negative potential side), the output voltage of the amplifying section 20 shifts to the reference potential side. In other words, in FIG. 5, the DC bias is deviated from the characteristic curve 70a to the left side toward the reference potential side.

A relationship between the bias current and the overtone oscillation as another point of the crystal oscillator circuit 8 of the present invention will be explained next.

Figure 7:
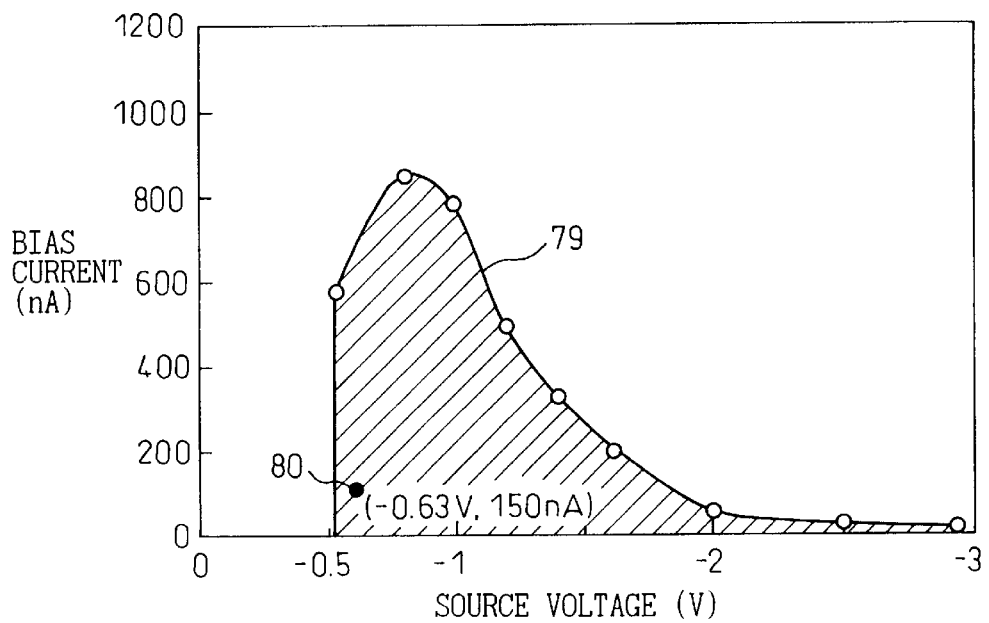
FIG. 7 is a characteristic diagram showing a relationship between a maximum bias current at which the crystal oscillator circuit of the present invention does not generate a overtone oscillation and a source voltage.

FIG. 7 is a diagram showing a relationship between the bias current and the overtone oscillation of the crystal oscillator circuit 8 according to the present invention shown in FIG. 2A. The overtone oscillation means an oscillation status that the oscillation is in a higher order like two times or three times the original oscillation frequency. In this example, the resonating section 10 of the oscillator circuit 30 has been set to resonate in 32.768 kHz. Therefore, in the two-time overtone oscillation, the oscillation frequency becomes about 66 kHz. In the three-time overtone oscillation, the oscillation frequency becomes about 99 kHz.

The overtone oscillation is an abnormal oscillation from the viewpoint of the frequency set by the resonating section 10 of the oscillator circuit 30, and it is necessary to avoid this overtone oscillation on design.

The horizontal axis of the diagram shown in FIG. 7 represents a source voltage to be applied to the amplifying section 20, and the vertical axis represents a maximum bias current in which a overtone oscillation does not occur. FIG. 7 shows that when a bias current equal to or greater than that of a characteristic curve 79 shown in FIG. 7 has been applied relative to the source voltage that is applied to the amplifying section 20, the oscillator circuit 30 oscillates in overtone. In other words, when the source voltage and the bias current are set within an area (a shaded area) inside the characteristic curve 79 shown in FIG. 7, the oscillator circuit 30 oscillates normally, without the occurrence of a overtone oscillation.

A minimum source voltage at which the oscillator circuit 30 oscillates is –0.5 V. When the source voltage is gradually increased toward the negative side relative to the reference potential, a maximum bias current reaches a peak at around –0.8 V, and this rapidly decreases after around a point of –1.0 V. In other words, when the source voltage is increased, the range of bias current in which the oscillator circuit 30 executes normal oscillation becomes small.

In the above example, when the relationship between the bias current and the source voltage in FIG. 5 and the relationship between the source voltage and the normal oscillation region in FIG. 7, are referred to, it can be understood that a cross point 70 in FIG. 5 between the source voltage –0.63 V and the bias current. 150 nA corresponds to the point 80 in FIG. 7. From this point the constant current region (the saturation region) of the PMOSFET 21 that constitutes the amplifying section 20, and in the area in which overtone oscillation does not occur. From the above, it can be understood that the bias current and the overtone oscillation region are in a close relationship with the source voltage.

As explained above, as, the amplifying section 20 of the crystal oscillator circuit 8 shown in FIG. 2A operates in the exponential region the MOSFET, the amplication factor is determined based on the bias current that is the current flowing to the amplifying section 20. Therefore, during the oscillation starting period of the oscillator circuit 30, the bias current is increased, and during the steady oscillation period, the bias current to the amplifying section 20 is lowered to a level that is necessary to maintain the oscillation. In this way, it is possible to drive the circuit with low power. This changeover of the bias current is realized as follows. The control signal generator circuit 60 controls the reference current control section 44 according to the oscillation status and the non-oscillation status of the oscillator circuit 30, thereby to set the current to the reference current source circuit 51.

Further, this bias current is set such that the PMOSFET 21 of the amplifying section 20 operates in the constant current region., and is set in the stable region of the shaded lines that changes with the source voltage as shown in FIG. 7. Therefore, a overtone oscillation does not occur in the oscillator circuit 30.

Figure 8:
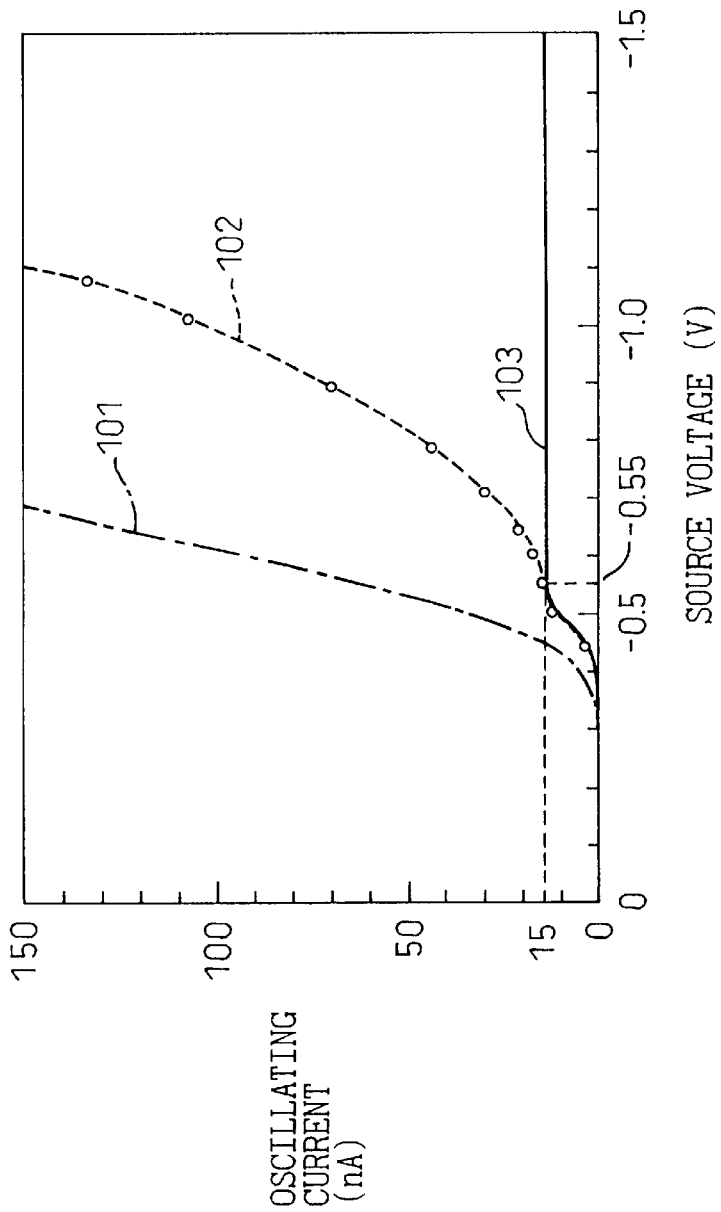
FIG. 8 is a characteristic diagram showing a relationship between an oscillating current and a source voltage when a bias current has been changed in the crystal oscillator circuit of the present invention shown in FIG. 2A.

FIG. 8 is a diagram showing one example of the operation of the crystal oscillator circuit 8 shown in FIG. 2A. The horizontal axis of the diagram represents a source voltage that is applied to the amplifying section 20, and the vertical axis represents an oscillating current of the oscillator circuit 30. The bias current during the oscillation starting period, i.e., the non-oscillation status, of the oscillator circuit 30 is set to 150 nA, and the bias current during the steady oscillation status is set to 10 nA. The source voltage actually applied is set to –0.63 V.

A characteristic curve 101 in FIG. 8 shows a status that the bias current has been set to 150 nA during the oscillation starting period of the oscillator circuit 30. A characteristic curve 102 shows a status of the oscillating current that the oscillation of the oscillator circuit 30 has been detected and the bias current has decreased to 10 nA. When the source voltage is at –0.63 V, the oscillation of the oscillator circuit 30 is instantly started, without abnormal oscillation. During the steady oscillation period, a stable oscillation is obtained in the oscillating current 15 nA at the source voltage –0.63 V of the characteristic curve 102.

As explained above, according to the crystal oscillator circuit 8 of the present invention, as the reference current source circuit 51 constant-current biases the DC bias of the amplifying section 20 without depending on the source voltage, it is possible to lower the driving source voltage of the oscillator circuit 30. Further, as the oscillator circuit 30 operates in the exponential region of the MOSFET, the circuit for increasing the amplification factor during the oscillation starting period of the oscillator circuit 30 increases only the bias current of the amplifying section 20. Therefore, the oscillator circuit 30 can provide a stable oscillation with low power, without variations in the source voltage.

Second Embodiment

Figure 4:
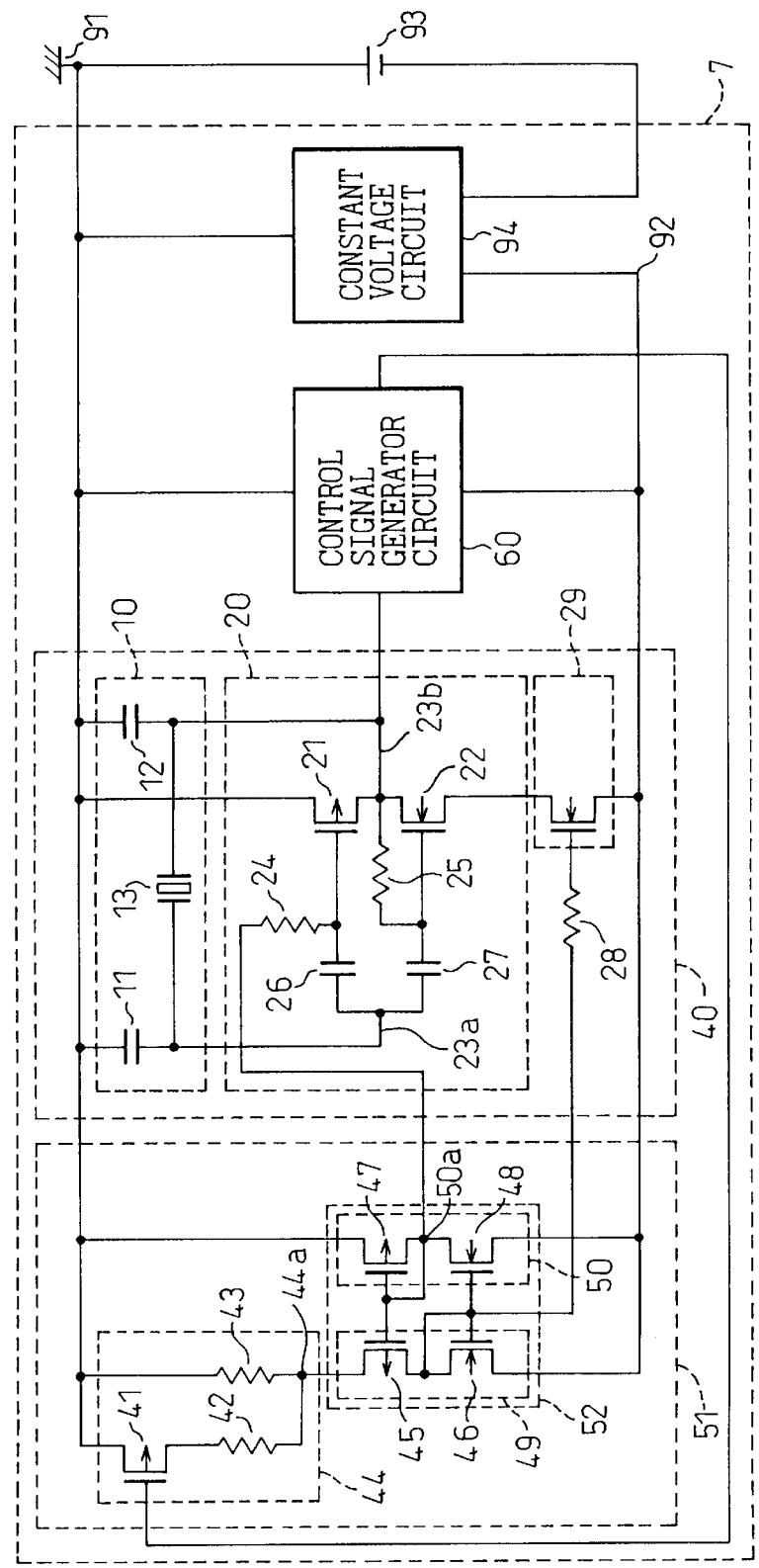
FIG. 4 is a circuit diagram showing a structure of a crystal oscillator circuit using a CMOSFET according to a second embodiment of the present invention.

Next, a structure of a crystal oscillator circuit 7 according to a second embodiment of the present invention will be explained. In FIG. 4, constituent elements of the circuit that are identical with those used in the crystal oscillator circuit 8 according to the first embodiment explained with reference to FIG. 2a will be attached with like reference numerals.

As shown in FIG. 4, the crystal oscillator circuit 7 of the second embodiment is constructed of a control signal generator circuit 60, a reference current source circuit 51 having a reference current control section 44 and a reference current generator section 52, an oscillator circuit 40 consisting of a resonating section 10, an amplifying section 20, and a current control device 29, and a constant-voltage circuit. 94.

The structures of the control signal generator circuit 60 and the reference current source circuit 51 are identical with those of the first embodiment explained using FIG. 2A and, therefore, an explanation will be omitted. In the second embodiment, the oscillator circuit 40 is constructed of the resonating section 10, the amplifying section 20, and the current control device 29. The structures of the resonating section 10 and the amplifying section 20 are also identical with those of the first embodiment and, therefore, an explanation will be omitted.

The structure of the crystal oscillator circuit 7 according to the second embodiment is different from the structure of the crystal oscillator circuit 8 according to the first embodiment only in that the crystal oscillator circuit 7 of the second embodiment is provided with the current control device 29 and the constant voltage circuit 94.

The current control device 29 is constructed of an NMOSFET. The constant-voltage circuit 94 is connected to a reference potential 91 and a battery 93, and is driven based on the source voltage of the battery 93. An output voltage of this constant-voltage circuit 94 is output from a line 92 as a regulated voltage that is obtained by lowering the source voltage. The line 92 is connected to is the control signal generator circuit 60, the reference current source circuit 51, and the oscillator circuit 40. The regulated voltage is applied to these circuits as the source voltage.

The current control device 29 is connected between the source of an NMOSFET 22 that constitutes the amplifying section 20 and the line 92. In other words, the current control device 29 is connected between the source of the PMOSFET 21 and the line 92. Further, the gate of the current control device 29 is connected to the gates of NMOSFETs 46 and 48 of the reference current source circuit 51 via a third high-resistance resistor 28. Therefore, a voltage applied to the gate of the current control device 29 is controlled by the reference current source circuit 51 via the third high-resistance resistor 28, and is linked to a change in the bias current of the amplifying section 20.

According to the crystal oscillator circuit 8 of the first embodiment, it is possible to lower the absolute value of the source voltage. On the other hand, the crystal oscillator circuit 7 of the second embodiment is effective for application to the case where a separate circuit connected to the crystal oscillator circuit 7 (a circuit after the crystal oscillator circuit), for example, a divider, cannot operate at a low voltage that is the same as the driving voltage of the oscillator circuit 40. In other words, the crystal oscillator circuit 7 is effective for application to the case where the frequency-driving circuit is driven at a regulated voltage obtained by lowering the source voltage to a level at which the divider can operate, and further when it is desired to lower the driving voltage of the oscillator circuit 40 to below the regulated voltage. According to the second embodiment, the reference current source circuit 51 can control the current that flows to the current control device 29, using the voltage applied to the current control device 29 as the regulated voltage.

Next, the operation of the crystal oscillator circuit 7 according to the second embodiment will be explained.

Referring to FIG. 8, a characteristic curve. 103 shows a relationship between the oscillating current and the source voltage of the crystal oscillator circuit 7 shown in FIG. 4. In a similar manner to that of the crystal oscillator circuit 8 of the first embodiment, the bias current is set such that the PMOSFET 21 of the amplifying section 20 is positioned in the constant current region relative to the source voltage, and in the region in which a overtone oscillation does not occur. In this embodiment, the regulated voltage as the source voltage is set to −0.7 V, the bias current during the oscillation starting period of the oscillator circuit 40 is set to 150 nA, and the bias current during the steady 34 oscillation period is set to 10 nA.

During the oscillation starting period of the oscillator circuit 40, the bias current of 150 nA flows to the PMOSFET 21 of the amplifying section 20. After the oscillation of the oscillator circuit 40 has been detected, the bias current decreases to 10 nA that is the set bias current during the steady oscillation period as described above. When the current control device 29 has not been provided, the oscillating current of the oscillator circuit 40 is determined based on the characteristic curve 102 shown in FIG. 8, and becomes 30 nA at the regulated voltage −0.7 V.

On the other hand, when the current control-device 29 has been provided as shown in FIG. 4, the oscillating current of the oscillator circuit 40 is controlled by the current control device 29, and becomes 15 nA as shown in the characteristic curve 103. In this instance, even when the regulated voltage is −0.7 V, the oscillating current of the oscillator circuit 40 is limited to 15 nA by the current control device 29. Therefore, it is understood from the characteristic curve 103 shown in FIG. 8 that the source voltage actually applied to the amplifying section 20 becomes about −0.55 V at the point where the oscillating current becomes 15 nA.

As explained above, when the circuit after the oscillator circuit cannot be driven at a low voltage, the divider that is the circuit after the oscillator circuit is driven at the regulated voltage. The oscillator circuit 40 constant-current controls itself using the current control device 29. As a result, it is substantially possible to lower the voltage applied to the oscillator circuit 40 to a level lower than the regulated voltage. In this case, as in the first embodiment, the crystal oscillator circuit 7 constant-current biases the DC bias of the amplifying section 20 with the reference current source circuit 51, without depending on the source voltage. Therefore, it is possible to lower the driving source voltage of the oscillator circuit 40. Further, as the oscillator circuit 40 operates in the exponential region of the MOSFET, the circuit for increasing the amplification factor during the oscillation starting period of the oscillator circuit 40 increases only the bias current of the amplifying section 20. As a result, it is possible to obtain a stable oscillation with low power, without variations in the source voltage. (First application example of the crystal oscillator circuit of the present invention) Next, a structure of the application of the crystal oscillator circuit 7 of the present invention shown in FIG. 4 to a portable electronic device, for example, an electronic timepiece, will be explained with reference to FIG. 9.

Figure 9:
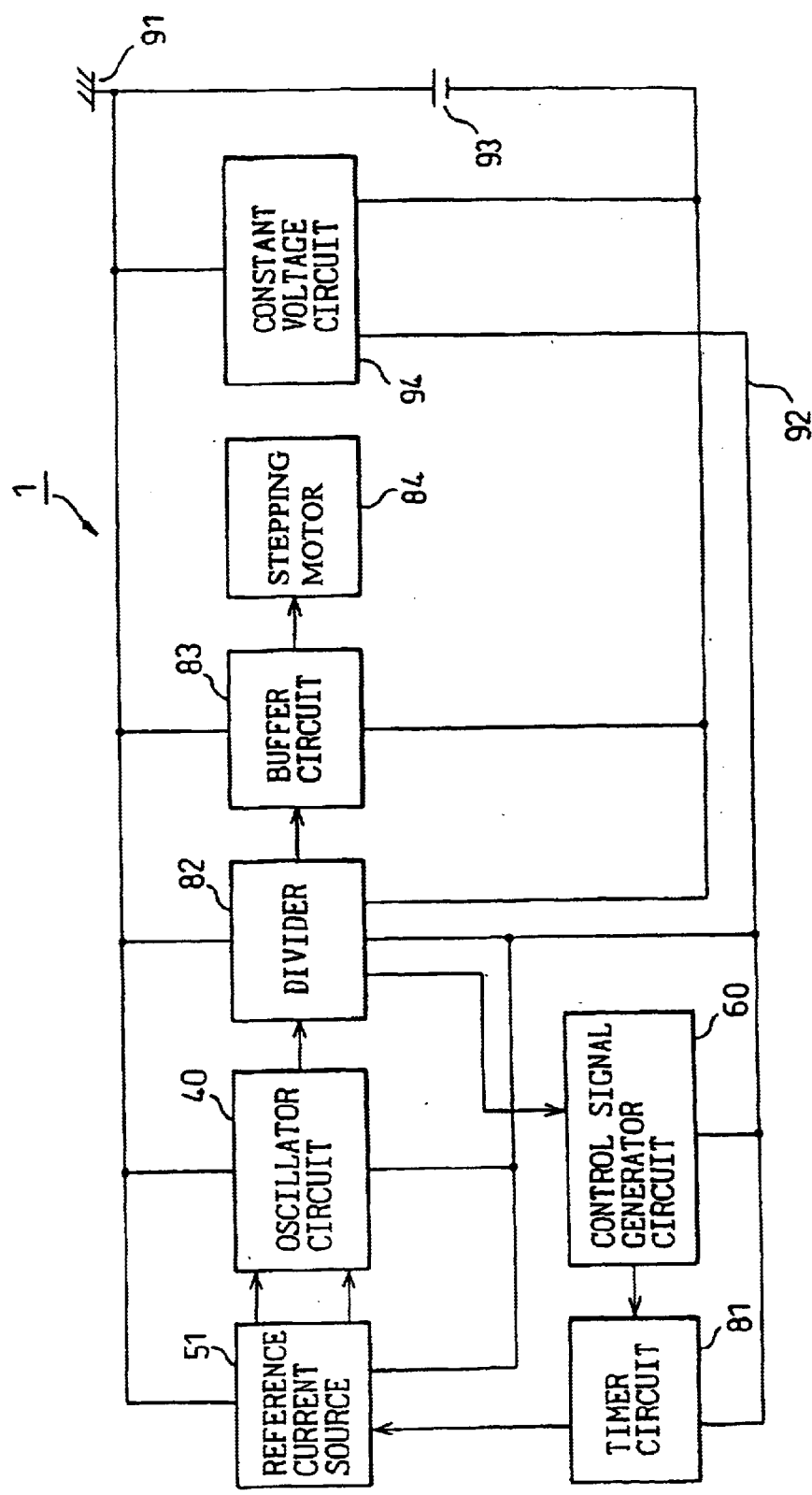
FIG. 9 is a block diagram showing a circuit structure when the crystal oscillator circuit of the present invention shown in FIG. 4 is used for An electronic timepiece.

An electronic timepiece 1 shown in FIG. 9 is constructed of a control signal generator circuit 60, a timer circuit 81, a reference current source circuit 51 having a reference current control circuit and a reference current generator circuit, an oscillator circuit 40 consisting of a resonating section, an amplifying section, and a current control device, a divider 82 for carrying-out various kinds of control such as the rotation of hands and timing adjustment of the electronic timepiece, a buffer circuit 83, a stepping motor 84 for driving various gears to rotate the hands, and a constant-voltage circuit 94. In this electronic timepiece 1, the source voltage of a battery 93 is supplied to the divider 82, the buffer circuit 83, and the constant-voltage circuit 94. A regulated voltage obtained by lowering the source voltage of the battery 93 with the constant-voltage circuit 94 is supplied to the oscillator circuit 40, the reference current source circuit 51, the control signal generator circuit 60, the timer circuit 81, the divider 82, and the buffer circuit 83, via a line 92. In general, the resonating section for the electronic timepiece is adjusted to resonate at 32.768 kHz.

(Operation of the electronic timepiece in the first application example)

The operation of the electronic timepiece 1 having the structure as shown in FIG. 9 will be explained with reference to FIG. 4 and FIG. 9.

As shown in FIG. 9, an output of the oscillator circuit 40 is input to the divider 82, and a signal having a frequency 1 Hz is input to the buffer circuit 83, so that the stepping motor 84 is driven. The signal to be output from the buffer circuit 83 for driving the stepping motor 84 has been raised from a regulated voltage to a voltage of the battery 93 as the source voltage in advance. The control signal generator circuit 60 detects the oscillation status and the non-oscillation status of the oscillator circuit 40. The reference current control section 44 of the reference current source circuit 51 is controlled via the timer circuit 81. In order to ensure the detection of the oscillation status of the oscillator circuit 40, the timer circuit 81 outputs the oscillation detection signal after a lapse of an optional time, to the gate of the control MOSFET 41 of the reference current control section 44.

During the non-oscillation period of the oscillator circuit 40, that is, when the electronic timepiece 1 is to be driven in its stop status because the oscillation stopped, the control signal generator circuit 60 detects the oscillation stop of the oscillator circuit 40, as shown in FIG. 4. The control signal generator circuit 60 applies the ON signal to the gate of the control MOSFET 41 of the reference current control section 44. The signal to be input to the gate in order to turn ON the control MOSFET 41 is at the low level.

In this status, the first reference resistor 42 in low resistance and the second reference resistor 43 in high resistance of the reference current control section 44 enter a parallel connection status. Therefore, the combined resistance is determined by the first reference resistor 42 having low resistance. Consequently, the bias current of the PMOSFET 21 that constitutes the amplifying section 20 is determined, based on the reference current determined by the first reference resistor 42. At this time, the oscillator circuit 40 obtains a sufficient amplification factor during the oscillation starting period, starts oscillation, and reaches the steady oscillation status thereafter.

When the oscillation amplitude necessary for operating the divider 82 has been obtained from the oscillator circuit 40, all circuits for driving the electronic timepiece 1 operate. A signal output from the divider 82 is input to the control signal generator circuit 60, and the oscillation status is detected. When the oscillation of the oscillator circuit 40 has been detected, the timer circuit 81 holds this status only, during the oscillation stabilization period (for example, 500 ms). Then, the control MOSFET 41 of the reference current control section 44 is turned OFF. At this time, a high signal is input to the gate of the control MOSFET 41 from the control signal generator circuit 60.

As the order of the off resistance of the control MOSFET 41 is larger than that of the second reference resistor 43 by a few digits, the combined resistance of the reference current control section 44 is determined by the second reference resistor 43, and the current that flows to the reference current source circuit 51 is determined. The bias current of the PMOSFET 21 that constitutes the amplifying section 20 is determined based on the reference current determined by the second reference resistor 43. The bias current of the PMOSFET 21 that constitutes the amplifying section 20 is lowered to a current that is the minimum necessary for steady oscillation.

According to the conventional crystal oscillator circuit 9 explained with reference to FIG. 1, the DC bias of the amplifying section 120 is automatically determined as one half of the source voltage. Therefore, it has been necessary that the source voltage is about two times the threshold voltages of the FETs 21 and 22 that constitute the amplifying section 120. Consequently, there has been a limit to lowering the source voltage. Further, according to the circuit that increases the amplification factor of the amplifying section 120 by changing over the voltage from the regulated voltage to the source voltage during the oscillation starting period of the oscillator circuit 130, a variation occurs in the source voltage at the time of changing over the voltage from the source voltage to the regulated voltage during the steady oscillation period of the oscillator circuit 130, because of low responsiveness to frequency of the regulator circuit. As a result, it has not possible to obtain a stable oscillation.

On the other hand, based on the application of the crystal oscillator circuit 7 of the present invention to the electronic timepiece 1, the time taken from when the oscillator circuit 40 starts oscillation until the oscillation becomes steady is within one second, without variations in the source voltage. During the steady oscillation period, the oscillator circuit 40 can operate stably in low current of 30 nA for all the circuits that drive the electronic timepiece 1.

(Second application example of the crystal oscillator circuit of the present invention)

The structure of the application of the crystal oscillator circuit 7 of the present invention shown in FIG. 4 to the electronic timepiece 1 has been explained with reference to FIG. 9. It is also possible to utilize the crystal oscillator circuit 8 of the present invention shown in FIG. 2A for an electronic timepiece. A circuit of an electronic timepiece 2 in this instance is shown in FIG. 10.

Figure 10:
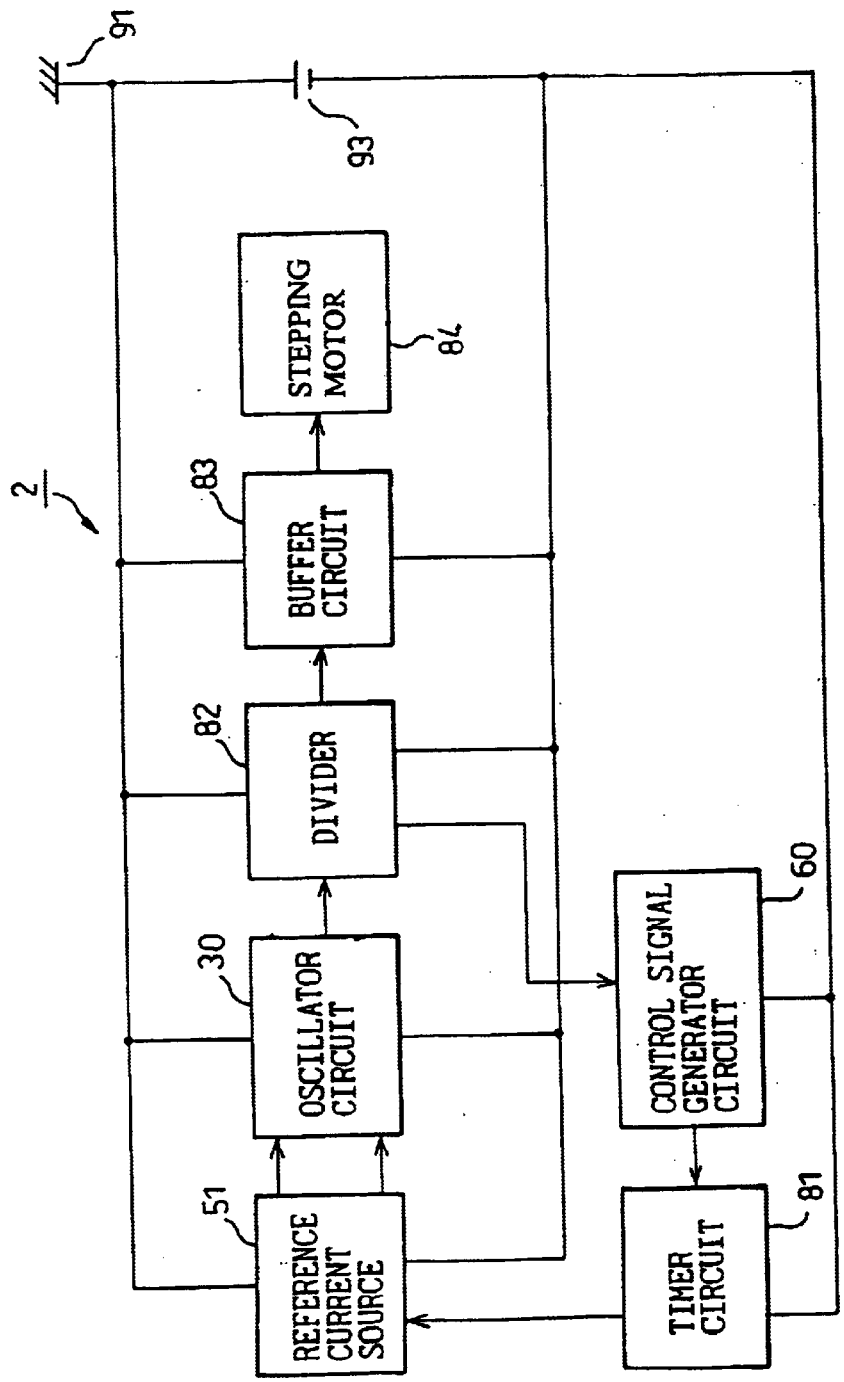
FIG. 10 is a block diagram showing a circuit structure when the crystal oscillator circuit of the present invention shown in FIG. 2A is used for an electronic timepiece.

An electronic timepiece 2 shown in FIG. 10 is constructed of a control signal generator circuit 60, a timer circuit 81, a reference current source circuit 51 having a reference current control circuit and a reference current generator circuit, an oscillator circuit 30 consisting of a resonating section, an amplifying section, and a current control device, a divider 82 for carrying out various kinds of control such as the rotation of hands and timing adjustment of the electronic timepiece, a buffer circuit 83, and a stepping motor 84 for driving various gears to rotate hands. In this electronic timepiece 2, the source voltage of the battery 93 is supplied to the whole circuits. The resonating section for the electronic timepiece 2 is also adjusted to resonate at 32.768 kHz.

The operation of the electronic timepiece 2 having the structure as shown in FIG. 10 is the same as the operation of the electronic timepiece 1 explained with reference to FIG. 9, except the portion of the source voltage. Therefore, an explanation of this operation will be omitted.

While the two embodiments of the crystal oscillator circuit according to the present invention have been explained above, the present invention is not limited to these embodiments. According to the crystal oscillator circuit of the present invention, as the reference current source circuit constant-current biases the DC bias of the amplifying section without depending on the source voltage, it is possible to lower the driving source voltage of the oscillator circuit. Further, as the oscillator circuit operates in the exponential region of the MOSFET, the circuit for increasing the amplification factor during the oscillation starting period of the oscillator circuit increases only the bias current of the amplifying section. Therefore, the oscillator circuit can provide a stable oscillation with low power, without variations in the source voltage. Further, according to the crystal oscillator circuit of the present invention, it is possible to minimize variations in characteristics during the period from when the oscillator circuit starts oscillation until the oscillation becomes steady, and make the circuit oscillate instantly at low power. Further, it is possible to obtain oscillation characteristics that make it possible to achieve a stable and steady oscillation.

What is claimed is:

1. A crystal oscillator circuit using CMOSFETs, the crystal oscillator circuit comprising:
    an oscillator circuit that is constructed of a resonating section having capacitors and a crystal oscillator, and an amplifying section having a CMOSFET for exciting the resonating section;
    a reference current source circuit for generating a reference current which determines a bias current of the amplifying section, said reference current source circuit having a reference current control section for setting a reference current and a reference current generator section for generating the reference current; and
    a control signal generator circuit that detects whether the oscillator circuit is in the oscillation status or in the non-oscillation status, and when the oscillator circuit is in the non-oscillation status, that generates a control signal for controlling the reference current control section to set the reference current which makes the bias current of said amplifying section larger than that in the oscillation status.

2. The crystal oscillator circuit according to claim 1, wherein
    the oscillator circuit, the reference current source circuit, and the control signal generator circuit are connected between a reference potential and the other end of a battery of which one electrode is connected to the reference potential, respectively, and the crystal oscillator circuit operates using the battery voltage as the source voltage.

3. The crystal oscillator circuit according to claim 2, wherein
    the reference current control section consists of at least two reference resistors connected in parallel between the reference potential and a connection point that is connected to the reference current generator section, and the crystal oscillator circuit changes over a value of a combined resistance of the reference resistors based on a control signal from the control signal generator circuit.

4. The crystal oscillator circuit according to claim 3, wherein
    the crystal oscillator circuit changes over the combined resistance based on ON/OFF of the control signal of at least one switching transistor that is connected in series with one of the reference resistors.

5. The crystal oscillator circuit according to claim 4, wherein
    the switching transistor is a control MOSFET.

6. The crystal oscillator circuit according to claim 1, wherein
    a constant-voltage circuit for generating a regulated voltage that is a lowered voltage of the source voltage of the battery is provided between a reference potential and the other end of a battery of which one electrode is connected to the reference potential, and
    the oscillator circuit, the reference current source circuit, and the control signal generator circuit are connected between the reference potential and a line for supplying this regulated voltage, respectively, and the crystal oscillator circuit operates using the regulated voltage as the source voltage.

7. The crystal oscillator circuit according to claim 6, wherein
    a current control device is connected between the amplifying section and the line, and the current control device is controlled by the reference current source circuit.

8. The crystal oscillator circuit according to claim 7, wherein
    the current control device is a NMOSFET, of which gate is connected to the reference current source circuit via a high-resistance resistor, and a voltage applied to the gate is linked to a change in the bias current to the amplifying section.

9. The crystal oscillator circuit according to any one of claims 1 to 8, wherein
    the control signal generator circuit has two charging and discharging circuits connected in 10 parallel that have mutually different charge and discharge statuses for the same input signal, output signals of the two charging and discharging circuits are input to an OR circuit, and an output of the OR circuit becomes the control signal.

* * * * *